US007659610B2

(12) United States Patent  
Chen et al.

(10) Patent No.: US 7,659,610 B2  
(45) Date of Patent: Feb. 9, 2010

(54) FLASH MEMORY CARD

(75) Inventors: Ben Wei Chen, Fremont, CA (US); David Hong-Dien Chen, Irvine, CA (US); Jason Japen Chen, Walnut, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 12/181,721

(22) Filed: Jul. 29, 2008

(65) Prior Publication Data

US 2008/0277782 A1 Nov. 13, 2008

Related U.S. Application Data

(63) Continuation of application No. 11/452,805, filed on Jun. 14, 2006, now Pat. No. 7,411,293, which is a continuation-in-part of application No. 11/237,283, filed on Sep. 27, 2005, now Pat. No. 7,411,292.

(51) Int. Cl.  
*H01L 23/02* (2006.01)

(52) U.S. Cl. .................. 257/686; 257/777; 257/724

(58) Field of Classification Search .......... 257/686, 257/777, 723, 724, 698  
See application file for complete search history.

(56) References Cited

U.S. PATENT DOCUMENTS

| 5,790,384 | A  | * | 8/1998 | Ahmad et al. ............ 361/760 |
| 6,381,143 | B1 |   | 4/2002 | Nakamura |
| 6,617,673 | B2 |   | 9/2003 | Lee et al. |
| 6,624,005 | B1 |   | 9/2003 | DiCaprio et al. |
| 6,879,047 | B1 |   | 4/2005 | Heo |
| 6,884,653 | B2 |   | 4/2005 | Larson |
| 7,151,010 | B2 | * | 12/2006 | Nguyen et al. ............ 438/107 |
| 7,176,506 | B2 | * | 2/2007 | Beroz et al. .............. 257/232 |
| 7,358,444 | B2 |   | 4/2008 | Nickerson et al. |
| 2005/0077607 | A1 | | 4/2005 | Hsieh et al. |
| 2006/0077644 | A1 | * | 4/2006 | Nickerson et al. ......... 361/767 |
| 2006/0087013 | A1 | * | 4/2006 | Hsieh ..................... 257/678 |
| 2006/0115928 | A1 | * | 6/2006 | Nguyen et al. ............ 438/107 |

FOREIGN PATENT DOCUMENTS

WO PCT/US2007/013825 8/2008

* cited by examiner

*Primary Examiner*—S. V Clark  
(74) *Attorney, Agent, or Firm*—Sawyer Law Group, P.C.

(57) ABSTRACT

A Flash memory card is disclosed comprising a substrate, a Flash memory die on top of the substrate, a controller die on top of the Flash memory die, and an interposer coupled to with the controller die and on top of the Flash memory die wherein the interposer results in substantial reduced wire bonding to the substrate. The interposer can surround or be placed side by side with the controller die. A system and method in accordance with the present invention achieves the following objectives: (1) takes advantage of as large of a Flash memory die as possible, to increase the density of the Flash card by reducing the number of wire bond pads on the substrate and enabling insertion of the largest die possible that can fit inside a given card interior boundary; (2) more efficiently stacks Flash memory dies to increase density of the Flash card; and (3) has a substantially less number of bonding wires to the substrate as possible, to improve production yield.

13 Claims, 14 Drawing Sheets

Invention (Top View)

FIG-2 Prior Art (Top View)

FIG-3 Prior Art (Cross Section View)

FIG-4 Prior Art – STACKING (Top View)

FIG-6 Invention (Top View)

FIG-7 Invention (Cross Section View)

FIG-8 (Cross Section View)

FIG-9 (Side View)

FIG-10 (Cross Section View)

FIG-11 (Cross Section View)

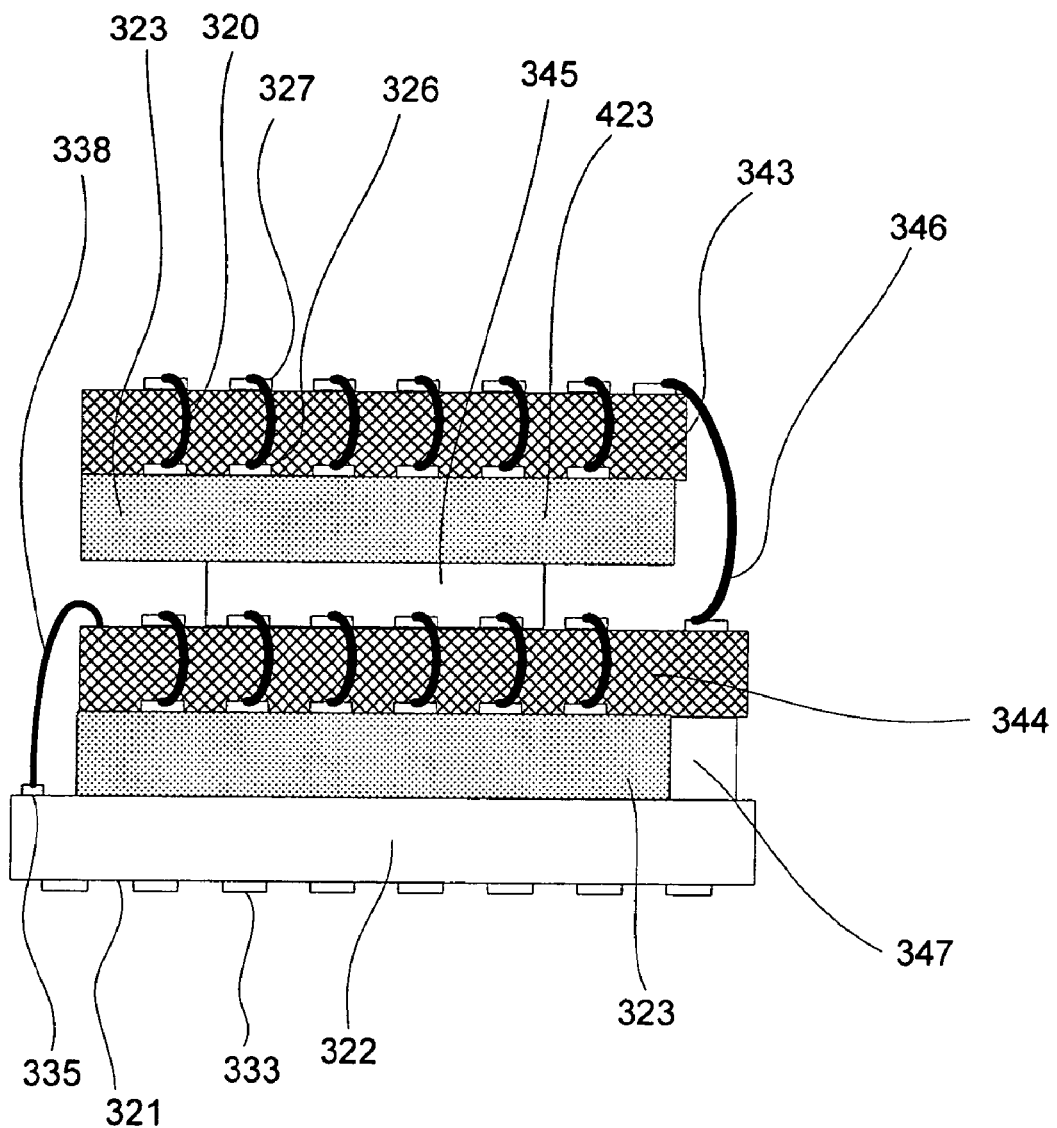
FIG-13 (Side View)

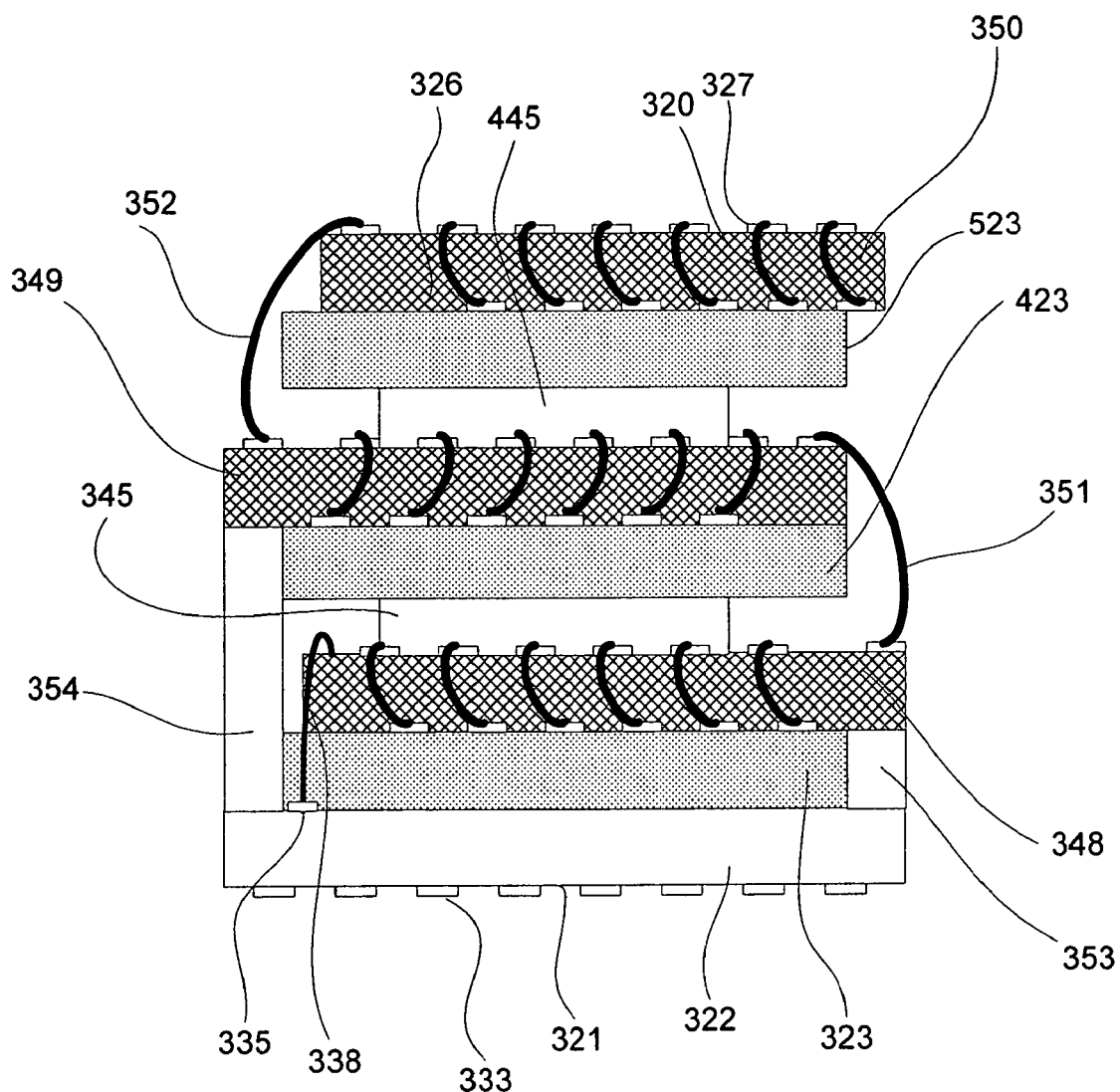
FIG-14 (Cross Section View)

FLASH MEMORY CARD

CROSS-REFERENCE TO RELATED APPLICATIONS

Under 35 U.S.C. §120 the present application is a continuation of U.S. patent application Ser. No. 11/452,805, filed Jun. 14, 2006, entitled "FLASH MEMORY CARD, which is a continuation-in-part of and claims the benefit of priority to U.S. patent application Ser. No. 11/237,283, filed Sep. 27, 2005, entitled "FLASH MEMORY CARD," a portion of which is incorporated herein by reference.

FIELD OF THE INVENTION

The present invention relates generally to Flash memory and more specifically to a high density Flash memory card.

BACKGROUND OF THE INVENTION

A Flash memory card application is driven mainly by consumer electronics products, such as a digital still camera (DSC), cell phone, PDA or MP3 player, toward a smaller form factor and high density. As the form factor becomes smaller while the density requirement grows higher, a need is created for innovative approaches to include as many Flash components into a limited space within the boundary of a particular Flash memory card.

Conventional approaches to pack more density into a Flash memory card are accomplished through wire bonding of one or more Flash memory dies and a Flash controller. A Flash memory die is usually much larger than a Flash controller die in physical size. The Flash memory dies and Flash controller are individually wire-bonded onto a substrate of the Flash memory card.

The substrate usually has interconnecting traces that serve to connect signals among the Flash controller, Flash memory dies and Flash card interface. The substrate is then molded with resin or covered with external casing and made into a finished Flash memory card.

For example, if there are approximately 40 signals and pads on the controller and approximately 20 signals and pads on each Flash memory die, placement constraints are created if both the Flash controller die and Flash memory dies are to be interconnected through wire bonding to the base substrate. Typically 60 pads on the substrate are required for one Flash memory die design and 20 more pads for each additional Flash memory die that is stacked. Therefore, the Flash memory die sizes have to be smaller to leave spaces for the wire bond pads. Furthermore, production yield problems are created due to the necessity of staggering bonding wires from multiple layers of dies.

Accordingly, what is needed is a system and method for providing a high density, small form factor Flash memory card which addresses the above-identified issues. The system should be easy to implement, cost effective and adaptable to existing systems. The present invention addresses such a need.

SUMMARY OF THE INVENTION

A Flash memory card is disclosed comprising a substrate, a Flash memory die on top of the substrate, a controller die on top of the Flash memory die, and an interposer coupled to with the controller die and on top of the Flash memory die wherein the interposer results in substantial reduced wire bonding to the substrate. The interposer can surround or be placed side by side with the controller die. A system and method in accordance with the present invention achieves the following objectives: (1) takes advantage of as large of a Flash memory die as possible, to increase the density of the Flash card by reducing the number of wire bond pads on the substrate and enabling insertion of the largest die possible that can fit inside a given card interior boundary; (2) more efficiently stacks Flash memory dies to increase density of the Flash card; and (3) has a substantially less number of bonding wires to the substrate as possible, to improve production yield.

BRIEF DESCRIPTION OF THE DRAWINGS

FIG. 13 is a side view of stacking two Flash memory dies design where the extended tab interposer is used.

FIG. 14 is a side view of stacking three Flash memory dies design where the extended tab interposer is used.

DETAILED DESCRIPTION

The present invention relates generally to Flash memory and more specifically to a high density Flash memory card. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
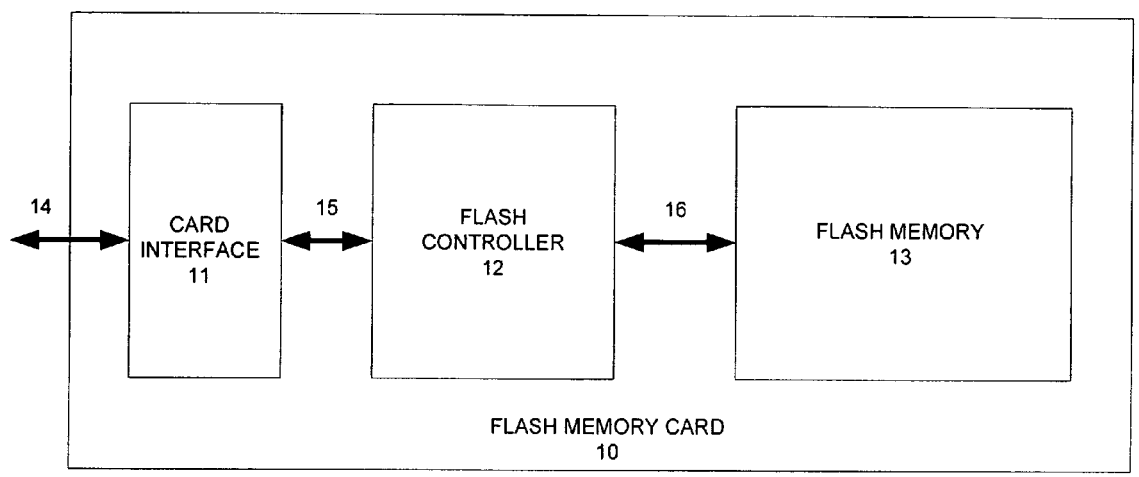
FIG. 1 shows Flash memory card architecture.

FIG. 1 shows a conventional Flash memory card 10. The Flash memory card 10 comprises a Flash card interface 11, a Flash memory controller 12 and one or more Flash memory dies 13. The Flash card interface 11, usually in the form of connector or gold finger contacts, serves as a communication channel to the host devices such as a digital still camera (DSC), cell phone, PDA, MP3 player or PC. The Flash controller 12 controls the on-card Flash memory 13 and responds to requests from the host devices through Flash card interface 11.

In the manufacturing process, the Flash controller 12 and Flash memory 13 are mounted on a piece of substrate that has a Flash card interface 11 built-in and interconnecting traces in-between the controller 12 and the Flash memory 13. The Flash controller 12 and Flash memory 13 can be in either bare die form or in a packaged form. The invention particularly focuses on the application where at least two bare die semiconductor components are used and the two components have different die sizes.

The conventional Flash memory card that utilizes die form components tends to adopt one of two approaches in the manufacturing process, called the side-by-side approach and the stacking approach. Both approaches will be described herein below.

Figure 2:
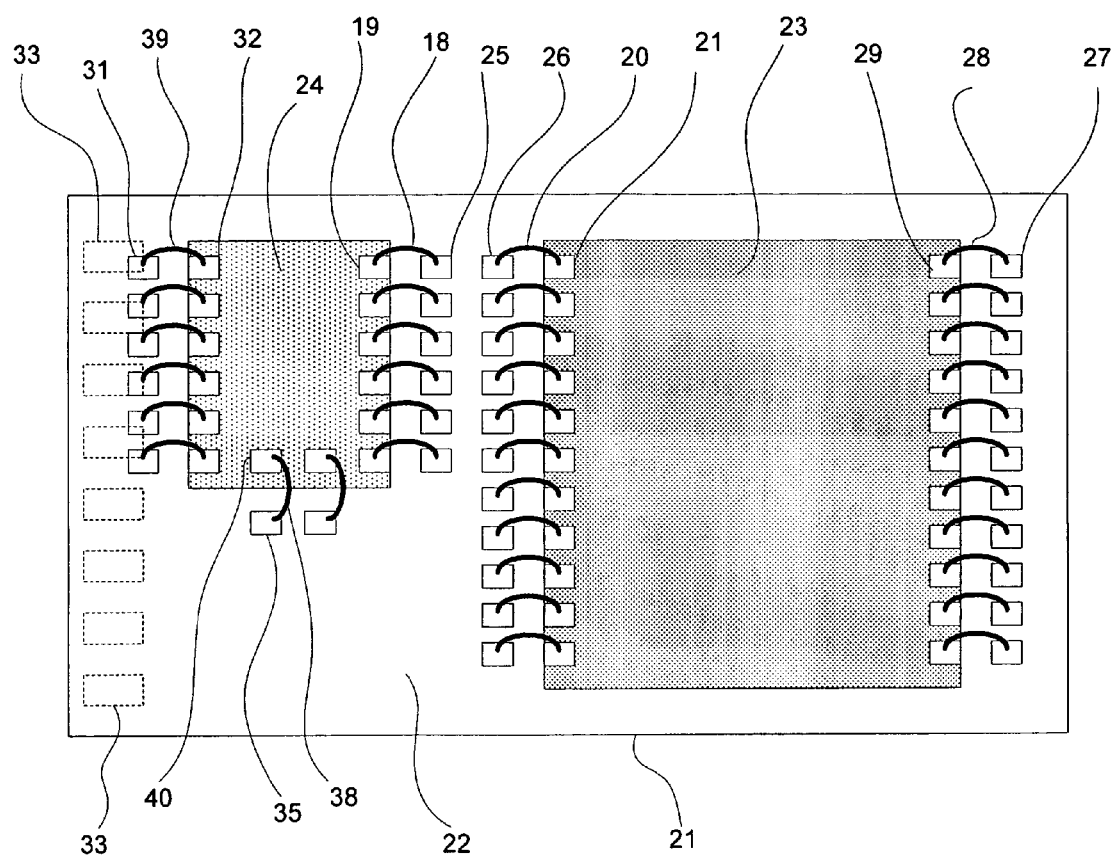
FIG. 2 shows a top view of wire-bonded substrate of a Flash memory card (prior art).
Figure 3:
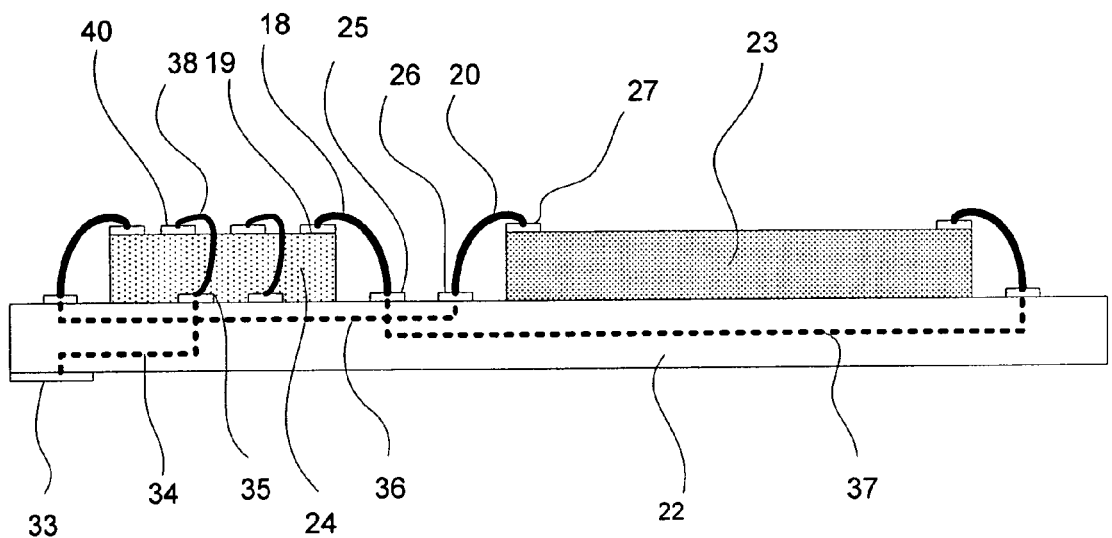
FIG. 3 shows a cross section view of wire-bonded substrate of a Flash memory card (prior art).

FIG. 2 shows the top view of a conventional layout of a larger Flash memory die 23, and a smaller controller die 24 on one side of the substrate 22 in a side-by-side approach. FIG. 3 shows a cross-sectional view of the same arrangement shown in FIG. 2.

In the side-by-side approach shown in FIG. 2, a Flash controller 24 and a Flash memory die 23 are placed side-by-side on a substrate 22. Wires 18, 20 and 38 are bonded from both dies on pads 19, 27 and 40 to the pads 25, 26 and 35 on the substrate 22 below, respectively. The substrate 22 needs to have about 30 pads to accommodate Flash controller 24 connection. An additional twenty 20 pads are required to accommodate Flash memory die 23 connection. As seen in FIG. 3, the substrate 22 is laminated with internal traces 34, 36 and 37 to connect among the Flash controller 24, the Flash memory die 23 and the Flash card interface 33. It is a relatively simple process in manufacturing with a side-by-side approach. However, this severely limits the die size of Flash memory and Flash controller usable for a given Flash memory card 21, because a total of 50 bonding wires and pads are required on the substrate 22.

Figure 4:
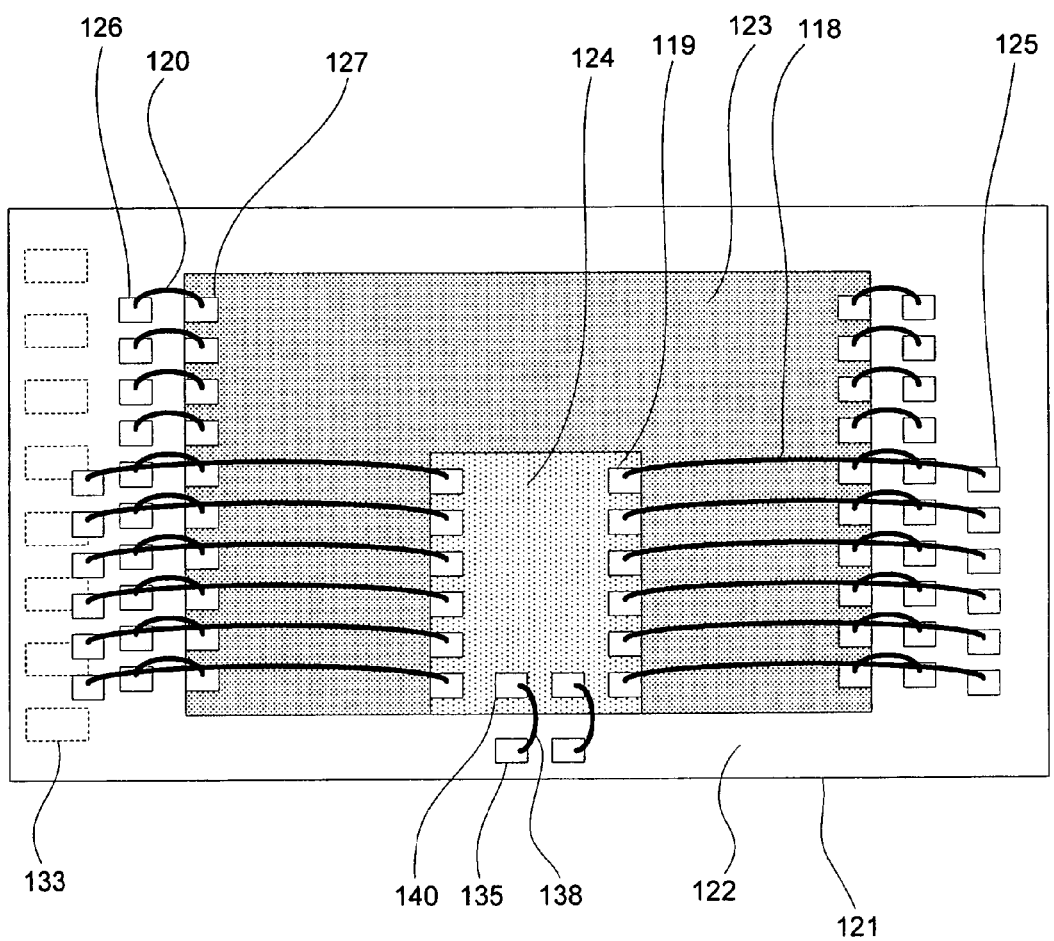
FIG. 4 shows a top view of staggered bonding wires from multiple layers of dies (prior art).
Figure 5:
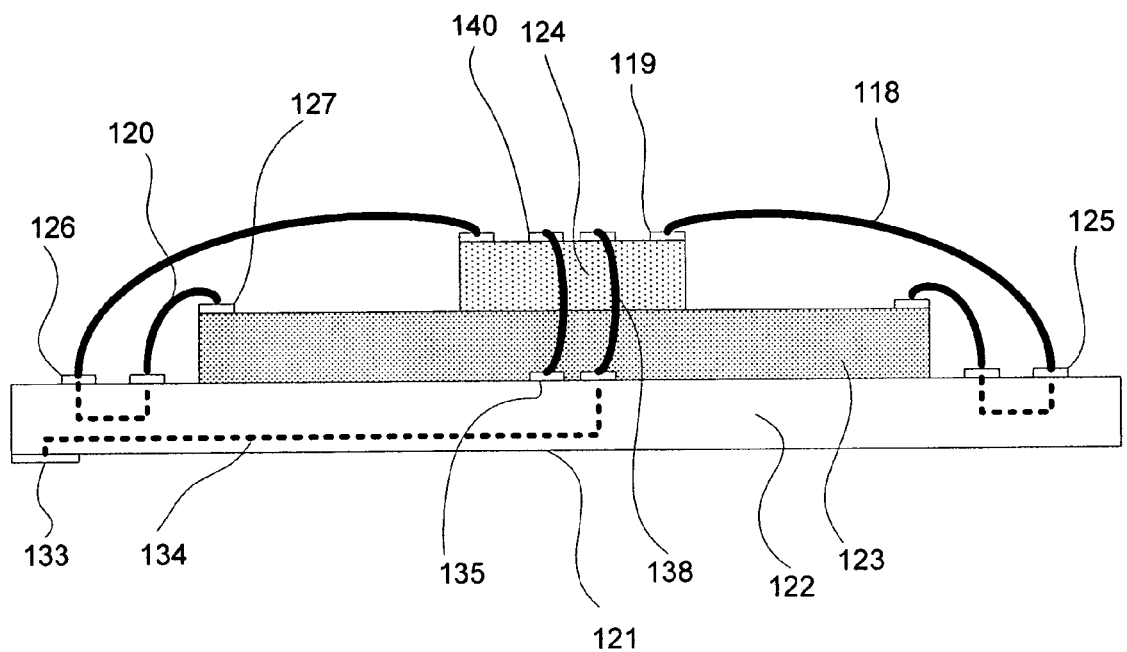
FIG. 5 is a cross section view of staggered bonding wires from multiple layers of dies (prior art).

FIG. 4 shows the top view of a conventional layout of a larger Flash memory die 123, and a smaller Flash controller die 124 on one side of the substrate 122 in a stacking approach. FIG. 5 shows a cross-sectional view of a conventional layout shown in FIG. 4.

In the stacking approach of FIG. 4, a Flash controller die 124 is placed on top of the Flash memory die 123 on a substrate 122. Wires 118, 120 and 138 are bonded from both dies on pads 119, 127 and 140 to the pads 125, 126 and 135 on the substrate below respectively. Due to multi-layer stacking, staggered wire bonding is necessary. The substrate 122 needs to have about 30 pads to accommodate Flash controller 124 connection. An additional 20 pads are required to accommodate Flash memory die 123 connection. As seen in FIG. 5, the substrate 122 is laminated with traces 134 to connect among the Flash controller 124, the Flash memory die 123 and the Flash card interface 133. This creates a limitation in Flash memory die size, as staggered wire bonding needs more space on the substrate 122 to distribute pads and wires. Space to accommodate a total of 50 additional bonding wires and pads is required on the substrate. Because the Flash controller is placed on top of the Flash memory die, there is less restriction in Flash controller die size compared to that of the side-by-side approach, where a larger controller die would reduce the size of the Flash as both of them compete for the same, common space available on the substrate.

The present invention addresses the restrictions of Flash memory die size in both conventional side-by-side and stacking approaches. The present invention further saves perimeter wire-bond space and simplifies wire-bonding complexity on the substrate. Consequently, larger die sizes containing more memory capacity can be used in either the side-by-side or stacking assembly.

A system and method in accordance with the present invention addresses the above-mentioned problems to achieve the following objectives: (1) Enable placement of the largest Flash memory die possible inside a given geometry to maximize the density of the Flash card by reducing the number of wire bond pads on the substrate. (2) Being able to efficiently stack Flash memory dies if necessary, to increase density of the Flash card. (3) Having as little bonding wires to the substrate as possible, to improve production yield.

To describe the features of the present invention in more detail, refer now to the following description in conjunction with the accompanying Figures.

Figure 6:
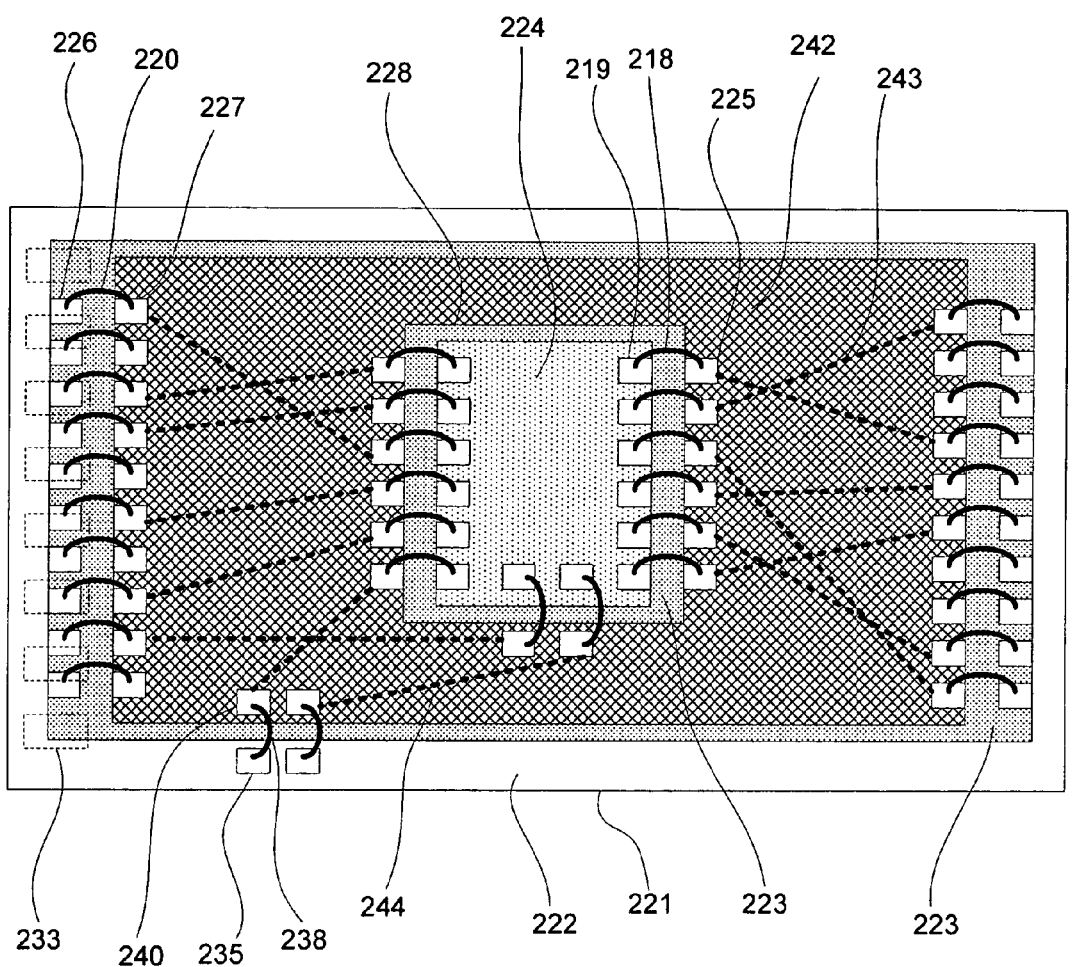
FIG. 6 is a top view of an on-die-interposer having a center cut out to accommodate Flash controller die.
Figure 7:
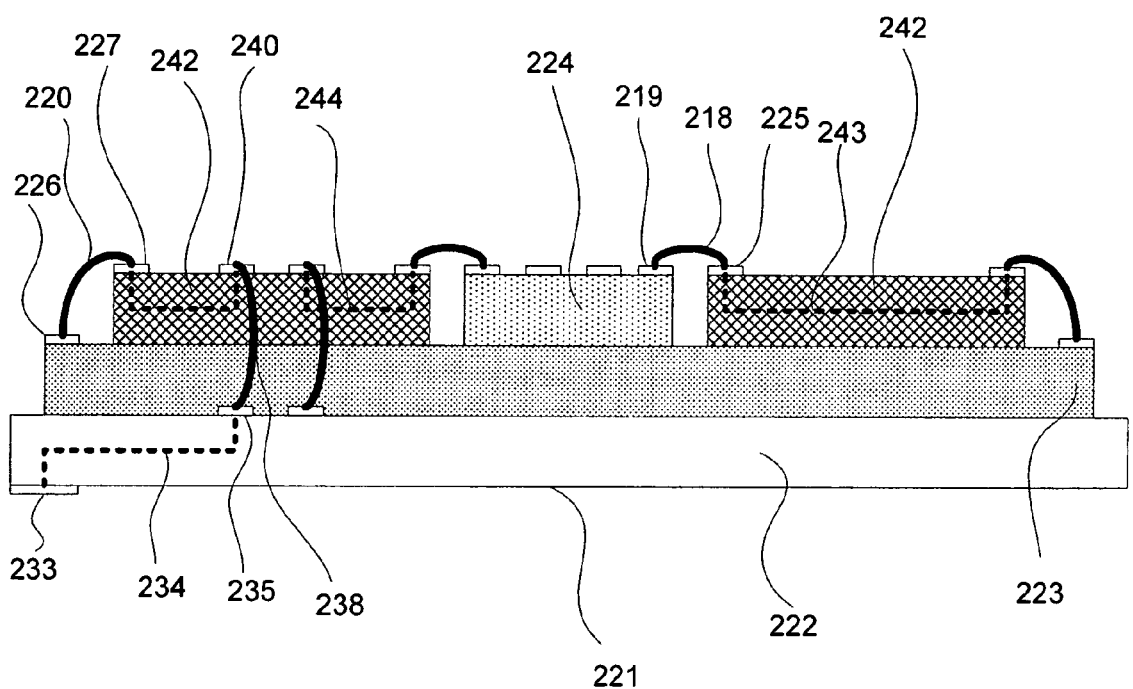
FIG. 7 is a cross-section view of an on-die interposer having a center cut out to accommodate Flash controller die.

FIG. 6 shows the top view of the Flash memory card in accordance with the present invention. The layout comprises a larger Flash memory die 223, a center cutout interposer 242 and a Flash controller die 224 on top of the substrate 222. FIG. 7 shows a cross-sectional view of the layout of FIG. 6.

In this embodiment an interposer 242 is on top of a Flash memory die 223 on a substrate 222, as shown in FIG. 6. The interposer 242 is a type of material similar to the substrate 222 that has bonding pads and is pre-fabricated with connecting traces 243 and 244. It can also be a thin, I-metal layer flex circuit made with copper/polyimide. The interposer 242 size is just large enough to allow its bonding pads 227 to be located next to the exposed Flash die pads 226. The interposer 242 has bonding pads 227, 225 conveniently fabricated to be close to the corresponding pads 226, 219 of the Flash memory die 223 below, and the Flash controller die 224 in the center, respectively, as shown in FIG. 6 and FIG. 7. It also has corresponding pads 240 that are conveniently fabricated to be able to connect the pads 235 on the main substrate 222 below the Flash memory die. These wires 238 from the interposer 242 are the only ones required to connect to the substrate 222 and are in turn connected to Flash card interface 233 through traces 234 on the substrate 222, as shown in FIG. 7.

Unlike the conventional approaches, the present invention shifts almost all wire bonding connection from die to substrate 222 below to interposer 242 in the middle of Flash card 221. This substantially reduces the pad space required on the substrate 222 by changing the number of pads on the substrate from in the order of 50 to less than 10, a saving of 80%. This saving in real estate on substrate 222 enables placement of a substantially larger Flash memory die previously not possible due to the space reserved for the bonding pads. Further, with the usage of interposer 242, the Flash controller die 224 does not need to be placed directly on top of substrate 222. There is, therefore, less restriction on the Flash controller die size, which has the same benefit as that of the conventional stacking approach. Typically, this invention improves the ratio of Flash memory die size to actual Flash memory card size from about 62% to 90% or higher. It allows for a larger Flash memory die, and therefore a higher density die to be used on the same Flash memory card 221 design.

In order not to introduce extra height while stacking Flash controller die 224 on the interposer 242, that is, sitting on top of Flash memory die 223, the interposer 242 has a cut-out 228 in the middle area large enough to accommodate the Flash controller die 224, as shown in FIG. 6 and FIG. 7. The Flash controller die 224 sits like an island directly on top of the Flash memory die 223 instead of on the interposer 242.

Figure 8:
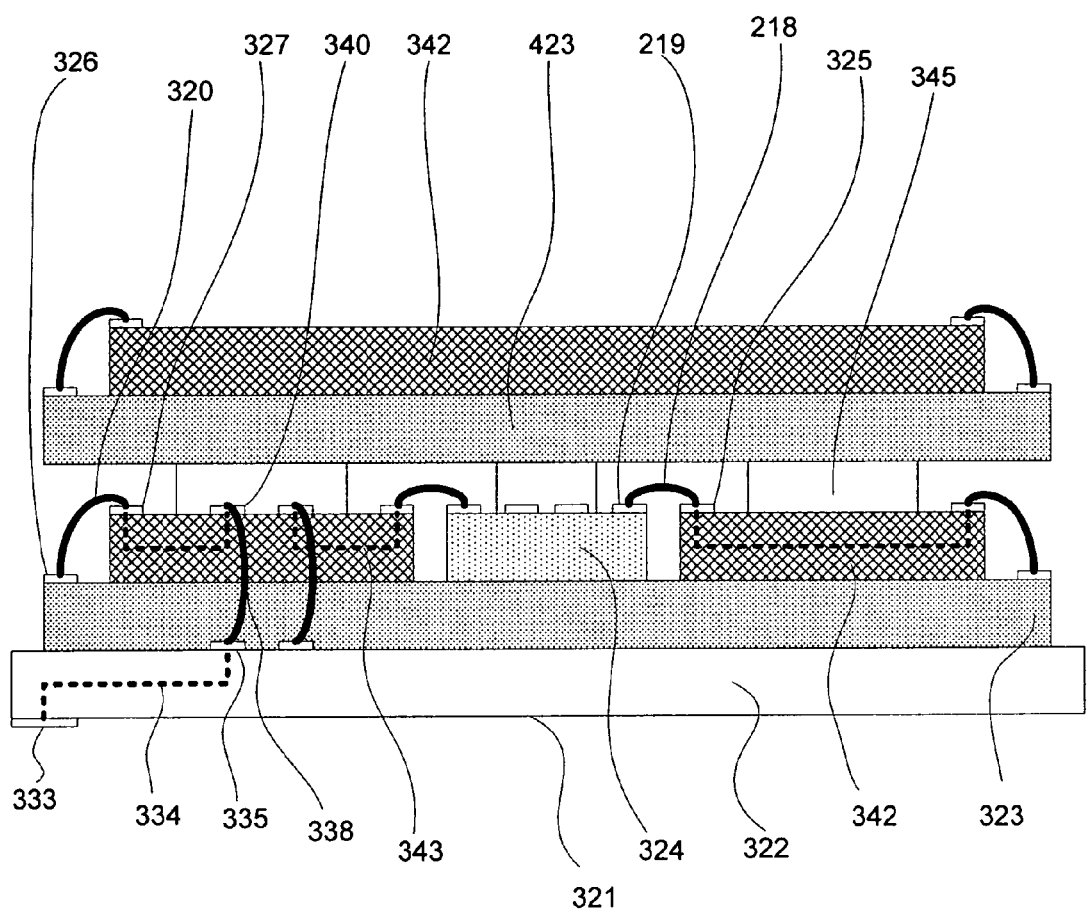
FIG. 8 is a cross-section view of stacking two Flash memory dies design.
Figure 9:
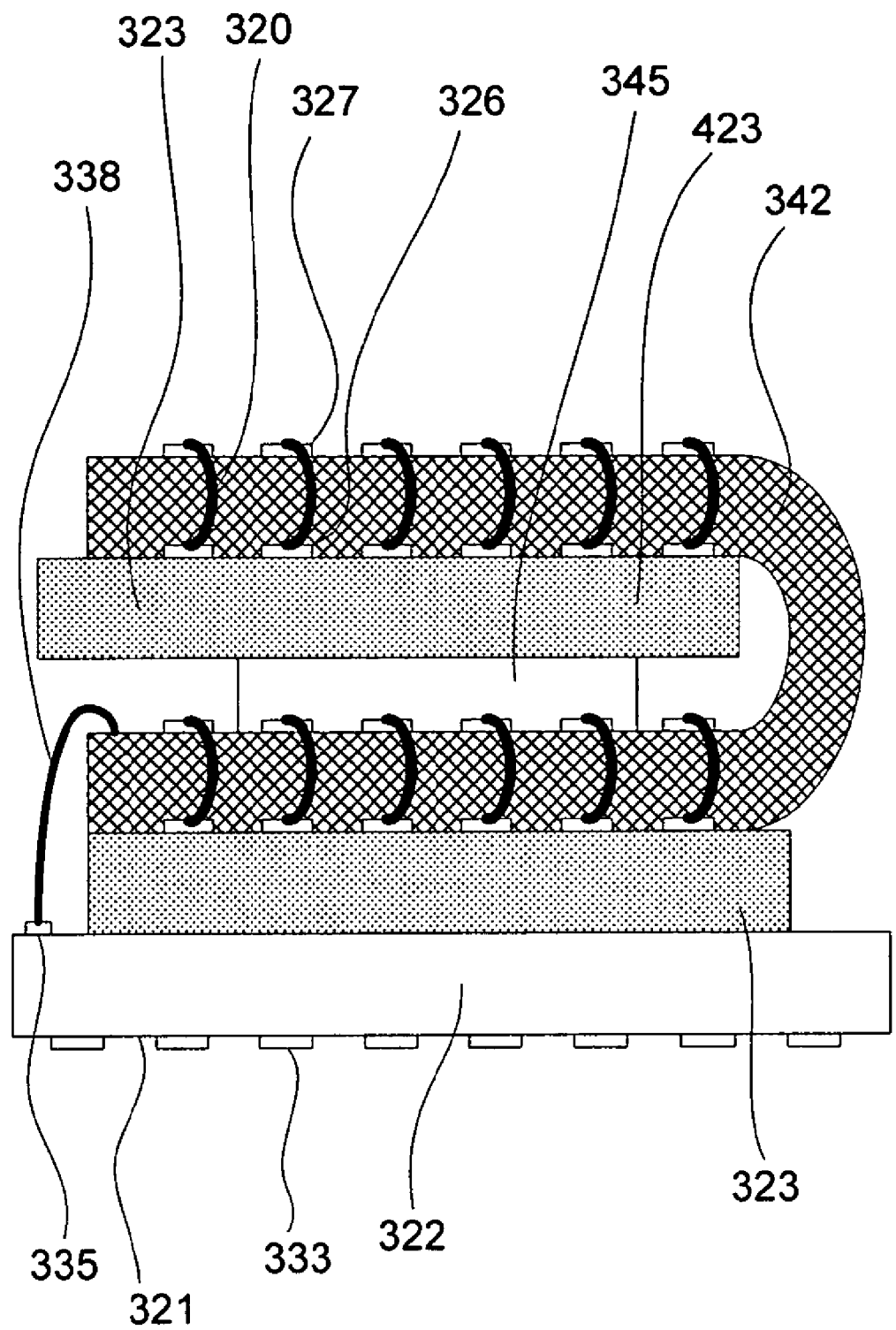
FIG. 9 is a side view of stacking two Flash memory dies design where the serpentine interposer is used.

If stacking of more Flash memory dies is necessary, then a flexible circuit on-die interposer 342 can be used, as shown in FIG. 8 and FIG. 9. Note that the flexible interposer 342 can be folded in a serpentine fashion to expand more stacking of Flash memory dies 323, 423 and 523, if necessary, as in FIG. 10 and FIG. 11.

If stacking of more Flash memory dies is necessary, then an extended tab interposer 344 can be used, as shown in FIG. 13. Additional wire bonding 346 is used to connect interposer 344 and 343. If the extended tab interposer 344 is not stiff enough to perform wire bonding process, a stand-off 347 can be added for additional support. Note that the extended tab interposers 348, 349 and wire bonding 351, 352 can be used to expend more stacking of Flash memory dies 323, 423 and 523, if necessary, as in FIG. 14. It is optional to use stand-off 353 and 354 for additional support for wire bonding process.

FIG. 8 shows the cross sectional view of the layout in accordance with the present invention with two Flash memory dies 323 and 423, a flexible circuit on-die interposer 342 and a Flash controller die 324 on top of the substrate 322. FIG. 9 shows a side view of the layout of FIG. 8.

A spacer 345 is necessary between the Flash controller die 324 and the Flash memory die 423 stacking above, as in FIG. 8 and FIG. 9. An additional spacer 445 is required if more stacking of Flash memory die 523 is needed, as shown in FIG. 10 and FIG. 11.

Figure 10:
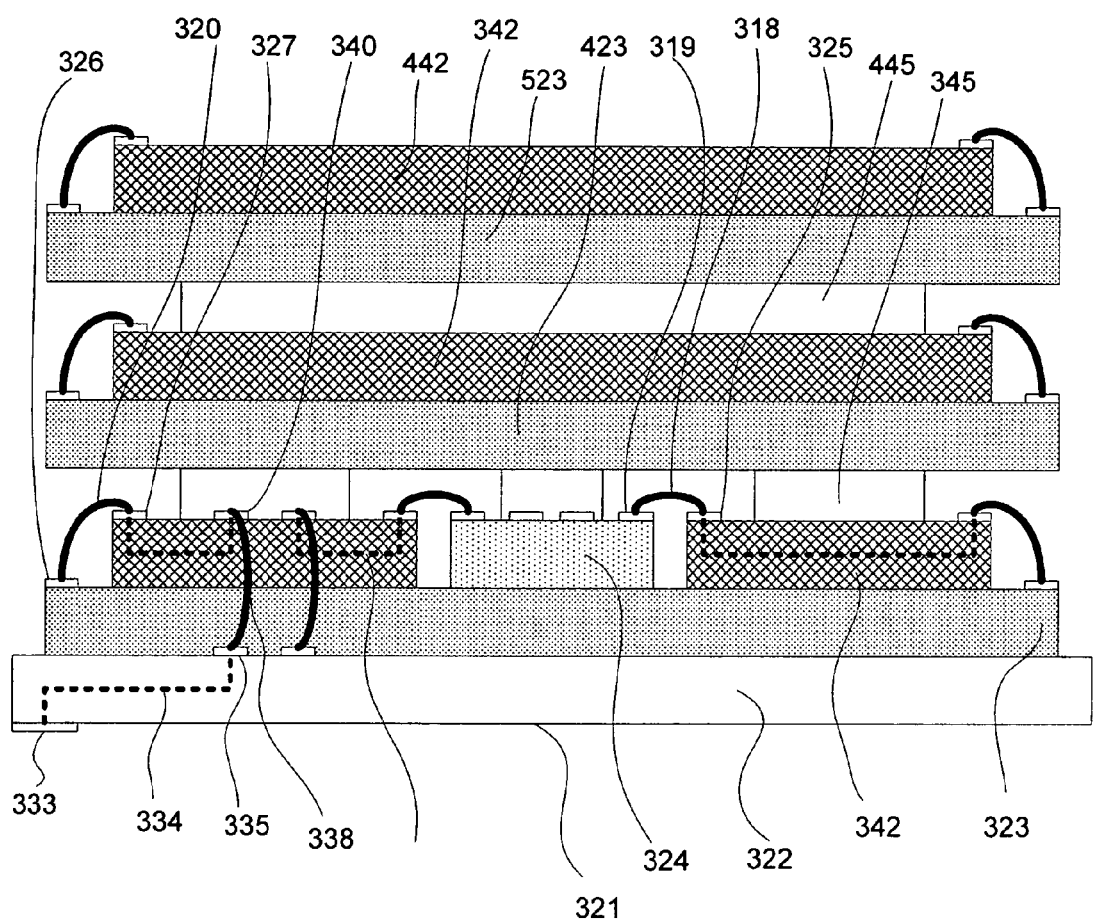
FIG. 10 is a cross section view of stacking three Flash memory dies design.
Figure 11:
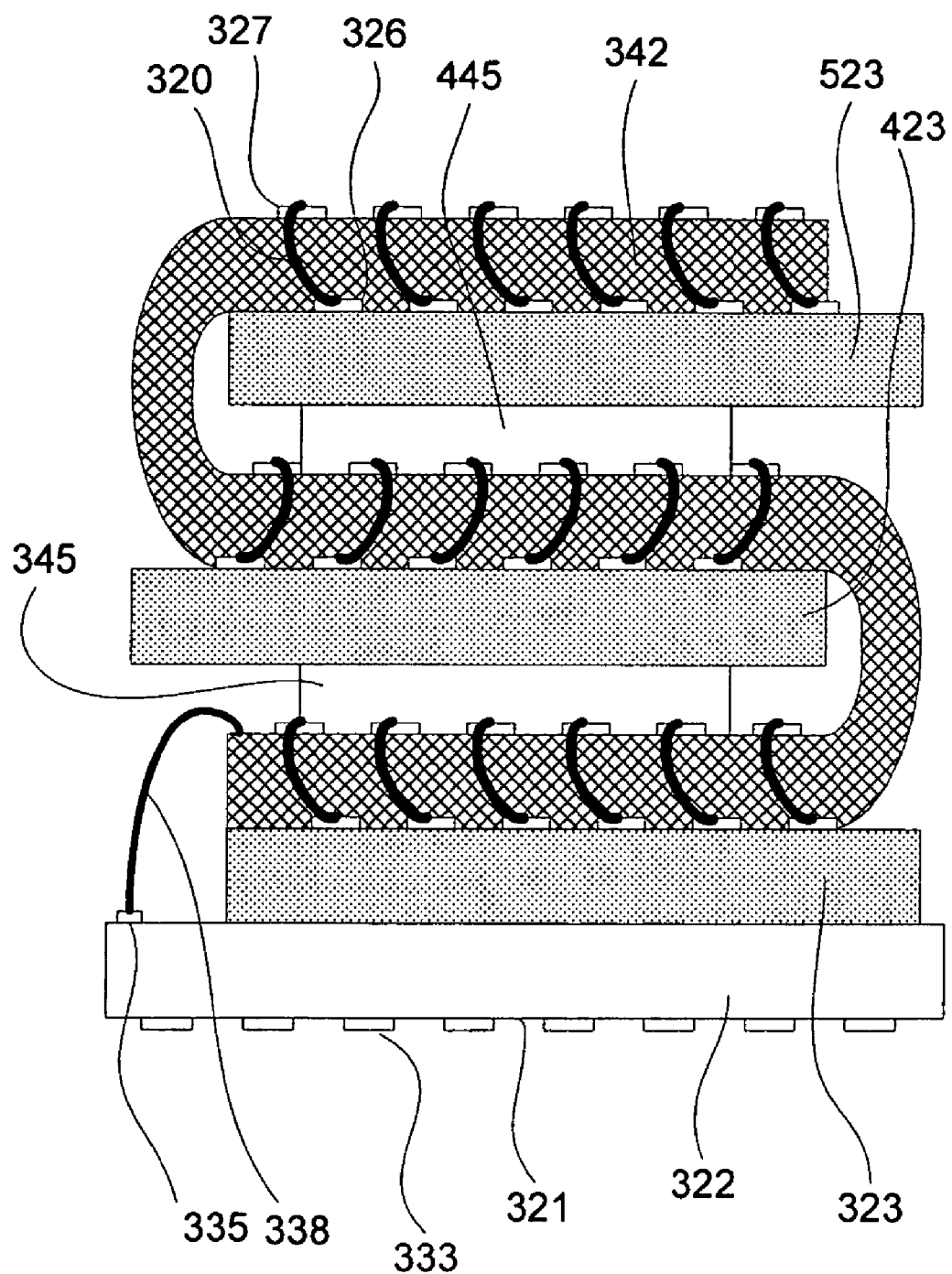
FIG. 11 is a side view of stacking three Flash memory dies design where the serpentine interposer is used.

FIG. 10 shows a cross sectional view of the layout in accordance with the present invention with three Flash memory dies 323, 423 and 523, a flexible circuit on-die interposer 342 and a Flash controller die 324 on top of the substrate 322. FIG. 11 shows a side view of the layout of FIG. 10.

The height of the spacer 345 and 445 is less than that of conventional stacking Flash memory card design. The reason is that spacer height is a function of the wire bonding loop height. The lower the loop height, the lower the spacer height is required. The loop height is also a function of the lateral distance between the two bonding pads, as shown in FIG. 12.

Figure 12:
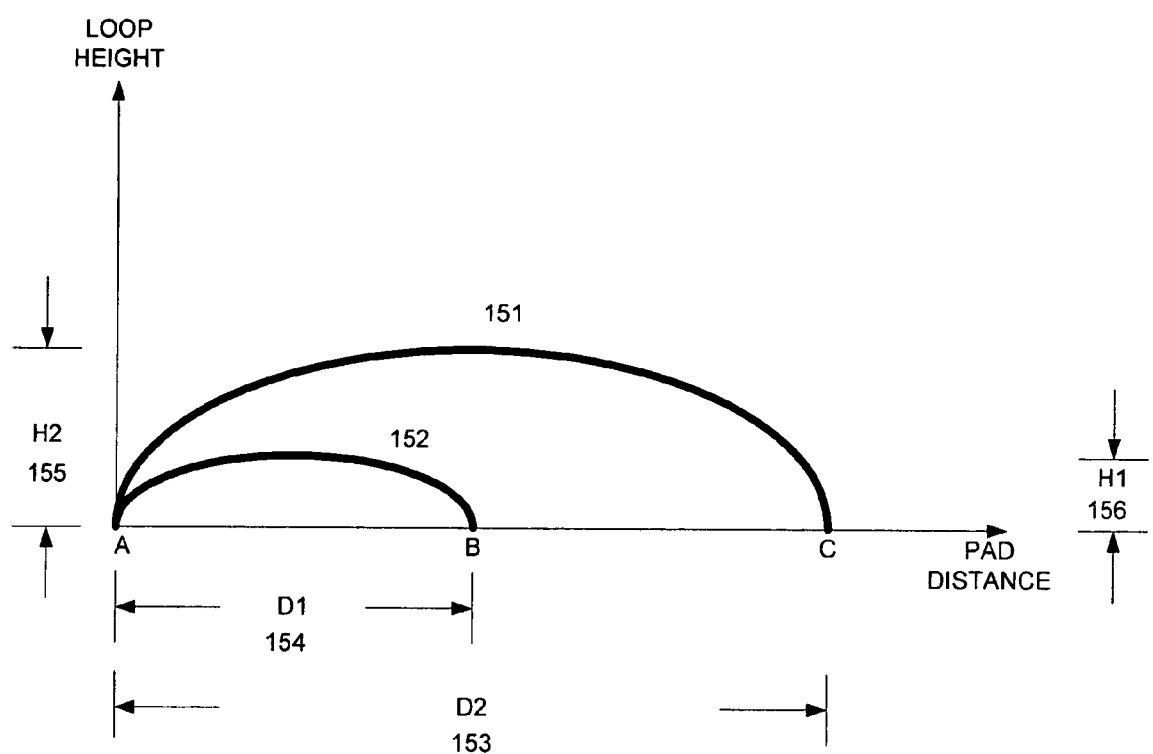
FIG. 12 is a relation curve between pad distance and loop height.

As shown in FIG. 12, the distance between pad A and pad B is DI 154. The distance between pad A and pad C is 02 153. The wires 151 and wire 152 are for these two pairs of pads respectively. Their corresponding loop heights are HI 156 and H2 155 respectively. The shorter the lateral distance DI 154, the lower the loop height HI 156 is necessary. Due to the use of the interposer 342, the corresponding pads 327 and 326 between interposer 342 and Flash memory dies 523, 423 and 323 can be right next to each other physically, as shown in FIG. 11. The corresponding pads 319 and 318 between interposer 342 and Flash controller die 324 can be right next to each other physically, as shown in FIG. 10. It therefore has the shortest wires possible between any corresponding pads and thus creates the lowest deterministic loop height possible. The net effect of lower spacer 345 and 445 results in more stacking height possible for Flash memory dies 323, 423 and 523 and achieves more density on Flash memory card 321 as a consequence.

Alternate Exemplary Embodiment

One alternative embodiment is to place the controller unit to the middle of the Flash memory die and use direct die-to-die wire bonding even without the need for an on-die interposer.

Yet another alternate embodiment is to form an on-die redistribution layer on the Flash memory in lieu of the on-die interposer. The only difference is that a redistribution layer can be fabricated on the Flash memory wafer, while the interposer is normally applied to the individual Flash memory die during substrate subassembly.

Another alternate embodiment is to use flexible substrate instead of flexible on-die interposer.

Advantages Over Prior Art

Unlike the conventional approach that brings all bonding wires from pads on Flash controller and Flash memory dies to the substrate, a Flash memory card in accordance with the present invention utilizes an on-die interposer, as shown in FIG. 6, to reduce the number of bonding wires. The interposer sits on top of the Flash memory die with bonding pads and traces to connect among Flash controller die, Flash memory die and Flash card interface, as shown in FIG. 7 and FIG. 8. Since the Flash card interface signals are limited in number (less than 10) and are usually controlled by the Flash controller, they are the only signals that need to be wire-bonded to the substrate. This will dramatically reduce wire-bonding pads on the substrate from about 50 to less than 10, a reduction by 80%.

The bonding wire length in this invention is more uniformly distributed with the on-die interposer than that of the conventional approach. No bonding wires have to cross over other wires as with prior art in Flash memory die stacking situation, as shown in FIG. 4.

Use of on-die interposer for wire-bond interconnect between the Flash memory die and Flash controller effectively reduces wire-bond space on the substrate and allows largest possible Flash memory die to be used on the Flash memory card, as illustrated in the die size shown in FIG. 4 (prior art) and FIG. 6 (present invention).

Use of an on-die imposer for direct wire-bond to save perimeter wire-bond space on the substrate.

Use of center-cutout on-die interposer to accommodate Flash controller die. It reduces overall height and allows more density as shown in FIG. 9.

Use of flexible circuit on-die interposer to allow expandable Flash memory die stacking.

The present invention also reduces bonding wire length through convenient interposer pads nearby. It further reduces the loop height of bonding wire, allowing the use of spacers having less thickness. As a consequence, more stacking of Flash memory dies can be achieved in the same Flash memory card.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A Flash memory card comprising:
   a substrate, the substrate including a first plurality of bonding pads;
   a Flash memory die on top of the substrate, the Flash memory die including a second plurality of bonding pads that are located in proximity to the first plurality of bonding pads;
   a controller die on top of the Flash memory die; and
   a interposer coupled to the controller die and on top of the Flash memory die, the interposer including a third plurality of bonding pads that are in proximity to the first and second plurality of bonding pads to allow for wire connections therebetween.

2. The Flash memory card of claim 1 wherein the interposer surrounds the controller die.

3. The Flash memory card of claim 1 wherein the interposer is placed side by side with the controller die.

4. The Flash memory card of claim 1 wherein the interposer is on top of the controller.

5. The Flash memory card of claim 2 which includes a second Flash memory die coupled to the interposer and a spacer for separating the Flash memory die from the second Flash memory die.

6. The Flash memory card of claim 2 wherein the interposer includes a cut out in a middle area large enough to accommodate the Flash controller die.

7. The Flash memory card of claim 1 wherein the interposer comprises a serpentine flexible on die member.

8. The Flash memory card of claim 1 wherein the interposer comprises an extended tab and a supporting stand off underneath the extended tab, wherein the extended tab interposer hangs over the edge of the dies, and the wire bonding is used to connect from extended tab portion of the interposer to a second interposer on an upper level from the extended tab interposer.

9. A Flash memory card comprising:
   a substrate, the substrate including a first plurality of bonding pads;
   a first Flash memory die on top of the substrate, the Flash memory die including a second plurality of bonding pads that are located in proximity to the first plurality of bonding pads;
   a Flash controller die on top of the first Flash memory die;
   a serpentine interposer coupled on top of the first Flash memory die, the serpentine interposer including a third plurality of bonding pads that are in proximity to the first and second plurality of bonding pads to allow for wire connections therebetween; and
   a second Flash memory die; wherein the Flash memory die is coupled to the serpentine interposer die; and
   a spacer for separating the first Flash memory die from the second Flash memory die.

10. The Flash memory card of claim 9 wherein the serpentine interposer includes a cut out in a middle area large enough to accommodate the Flash controller die.

11. A Flash memory card comprising:
    a substrate, the substrate including a first plurality of bonding pads;
    a first Flash memory die on top of the substrate, the Flash memory die including a second plurality of bonding pads that are located in proximity to the first plurality of bonding pads;
    a Flash controller die on top of the first Flash memory die;
    an extended tab interposer coupled on top of the first Flash memory die, from the extended tab interposer, the extended tab interposer including a third plurality of bonding pads that are in proximity to the first and second plurality of bonding pads to allow for wire connections therebetween; a second Flash memory die; wherein the second Flash memory die is coupled to the extended tab interposer; and
    a spacer for separating the first Flash memory die from the second Flash memory die.

12. The Flash memory card of claim 11 wherein the extended tab interposer includes a plurality of bonding pads for at least one connecting wire bonding to a second interposer on an upper level from the extended tab interposer.

13. The Flash memory card of claim 11 wherein the extended tab interposer includes a cut out in a middle area large enough to accommodate the first and second Flash controller dies.

* * * * *